United States Patent [19]

Tsukagoshi et al.

[11] Patent Number: 4,922,441
[45] Date of Patent: May 1, 1990

[54] GATE ARRAY DEVICE HAVING A MEMORY CELL/INTERCONNECTION REGION

[75] Inventors: Toshihiro Tsukagoshi, Nishinomiya; Masanobu Fukushima, Osaka; Keiichi Yoshioka, Nishinomiya; Takashi Yasui, Kobe, all of Japan

[73] Assignee: Ricoh Company, Ltd., Tokyo, Japan

[21] Appl. No.: 143,715

[22] Filed: Jan. 14, 1988

[30] Foreign Application Priority Data

Jan. 19, 1987 [JP] Japan ................................. 62-11057
Jan. 19, 1987 [JP] Japan ................................. 62-11058
Feb. 18, 1987 [JP] Japan ................................. 62-36187

[51] Int. Cl.$^5$ ............................................. G06F 15/60
[52] U.S. Cl. ..................................... 364/491; 364/490; 364/489; 364/488
[58] Field of Search ............................... 364/488–491; 365/63, 154, 189; 357/40–46

[56] References Cited

U.S. PATENT DOCUMENTS

| | | | |
|---|---|---|---|
| 4,613,958 | 9/1986 | Culican et al. | 365/189 |
| 4,644,187 | 2/1987 | Haji | 364/491 |
| 4,668,972 | 5/1987 | Sato et al. | 357/42 |
| 4,675,849 | 6/1987 | Kinoshita | 365/189 |
| 4,724,531 | 2/1988 | Angleton et al. | 364/490 |
| 4,727,493 | 2/1988 | Taylor, Sr. | 364/491 |
| 4,750,027 | 6/1988 | Asami | 357/40 |
| 4,780,846 | 10/1988 | Tanabe et al. | 357/45 |

*Primary Examiner*—Parshotam S. Lall
*Assistant Examiner*—V. N. Trans
*Attorney, Agent, or Firm*—Oblon, Spivak, McClelland, Maier & Neustadt

[57] ABSTRACT

A gate array device includes a plurality of basic cell regions spaced apart from one another to thereby define a plurality of intermediate regions therebetween. Each intermediate region may serve either as a memory or function cell region or as an interconnection region at least partly. The memory cell region may be selectively defined as a ROM or a RAM by metallization. A test mode or a normal operating mode may be set selectively in accordance with a control signal. When the normal operating mode is set, an input terminal is operatively connected to a memory circuit through a logic circuit; whereas, when the test mode is set, the input terminal is directly connected to the memory circuit while bypassing the logic circuit. Also provided is a memory cell structure which can be defined as a RAM memory cell or as a ROM memory cell storing a selected binary data by metallization.

4 Claims, 8 Drawing Sheets

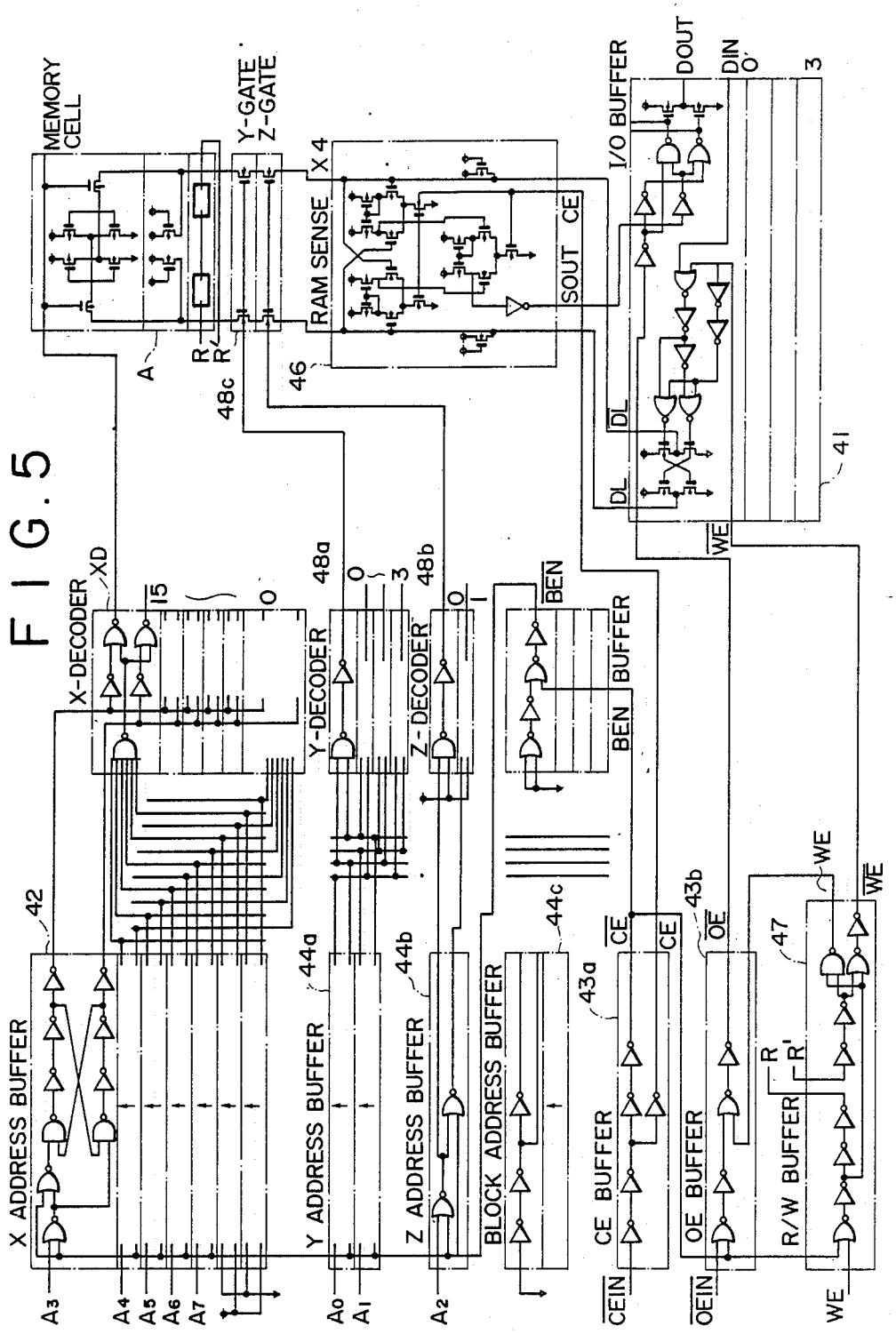
F I G. 5

GATE ARRAY DEVICE HAVING A MEMORY CELL/INTERCONNECTION REGION

BACKGROUND OF THE INVENTION

1. Field of the Invention

This invention generally relates to a semiconductor device, and, in particular, to a gate array type integrated circuit having a two dimensional array of basic cells.

2. Description of the Prior Art

A gate array device is well known in the art and it includes a two-dimensional array of logic cells which are selectively interconnected by metallization to define a desired logic function. Such a gate array device has a unique structure which is often referred to as the master-slice format. In accordance with this master-slice format, a plurality of basic cells are previously formed on a chip, and, then, according to the needs of a customer, an interconnection pattern for interconnecting selected ones of the basic cells to define a desired logic function is formed by metallization. Thus, such a master-slice format is suited for fabrication of a variety of integrated circuits in a short period of time at low cost.

However, in such a gate array device, when a function unit, such as a decoder for controlling memory cells, is constructed by using the basic cells of the gate array device, interconnections between the basic cells become extremely complicated and require a relatively large space. Thus, for example, as compared with the case in which use is made of a logic circuit device, such as a programmable logic array or simply PLA, the density tends to be lower. It is true that there has been proposed a master-slice type intergrated circuit having a plurality of alternately arranged logic and memory cell regions, whereby the memory cell regions may be selectively used as interconnection regions, as desired, as disclosed in the Japanese Patent Laid-open Pub. No. 59-11670. However, this Patent Laid-open Pub. only teaches to provide an intermediate memory cell/interconnection region between a pair of adjacent basic cell regions so that the intermediate region may be defined either as a memory cell region or as an interconnection region.

SUMMARY OF THE INVENTION

In accordance with one aspect of the present invention, there is provided an integrated circuit having a plurality of basic cell regions, which may be selectively interconnected to define a desired logic function. At least one memory cell region is provided between a pair of two adjacent basic cell regions, and at least one function cell region for controlling the operation of the memory cell region is also provided between a pair of two adjacent basic cell regions. These memory and function cell regions may be used as interconnection regions for interconnecting selected ones of the plurality of basic cell regions, if desired. Thus, an intermediate cell region provided between a pair of adjacent basic cell regions may be defined either as an interconnection region or as a memory cell region.

In accordance with another aspect of the present invention, there is provided an integrated circuit device which includes a memory cell having a first terminal, a MOS switch extendisng between a second terminal and a line, a third terminal connected to a reference potential. In the preferred embodiment of this aspect of the present invention, the integrated circuit is a gate array device including a plurality of basic cell regions, each comprising a plurality of memory cells, and, the memory cell includes a flip-flop. When it is desired to define a read only memory or simply ROM in the integrated circuit, an interconnection is defined between the second and third terminals by metallization to establish one binary state or the the second terminal is left unconnected to establish the other binary state. On the other hand, if it is desired to form a random access memory or simply RAM, an interconnection is defined between the first and second terminals by metallization.

In accordance with a further aspect of the present ivention, there is provided an integrated circuit including a memory cell region, a logic cell region for controlling the operation of the memory cell region and an input/output region for inputting or outputting data to or from the memory region. Also provided in the integrated circuit is detecting means for detecting a test command signal for commanding a test of the memory cell region and switching means for switching a connection of said input/output region between said logic cell region and said memory cell region in accordance with a detection signal from the detecting means.

It is therefore a primary object of the present invention to obviate the disadvantages of the prior art as described above and to provide an improved integrated circuit device.

Another object of the present invention is to provide an improved intergated circuit including a plurality of basic cell regions arranged in the form of a two-dimensional array.

A further object of the present invention is to provide an improved gate array device including at least one memory cell region and at least one function cell region between a pair of adjacent basic cell regions.

A still further object of the present invention is to provide an improved gate array device capable of defining not only a desired logic function but also a memory region.

A still further object of the present invention is to provide an improved gate array device having a unique memory cell structure capable of defining either of a fixed memory cell or an alterable memory cell.

A still further object of the present invention is to provide an improved gate array device in which testing a memory cell region can be carried out with ease.

Other objects, advantages and novel features of the present invention will become apparent from the following detailed description of the invention when considered in conjunction with the accompanying drawings.

BRIEF DESCRIPTION OF THE DRAWINGS

FIG. 5 is a schematic illustration showing the detailed structure of a gate array device including a RAM defined by applying a suitable interconnection by metallization to the structure shown in FIGS. 1 and 2;

DESCRIPTION OF THE PREFERRED EMBODIMENTS

Figure 1:
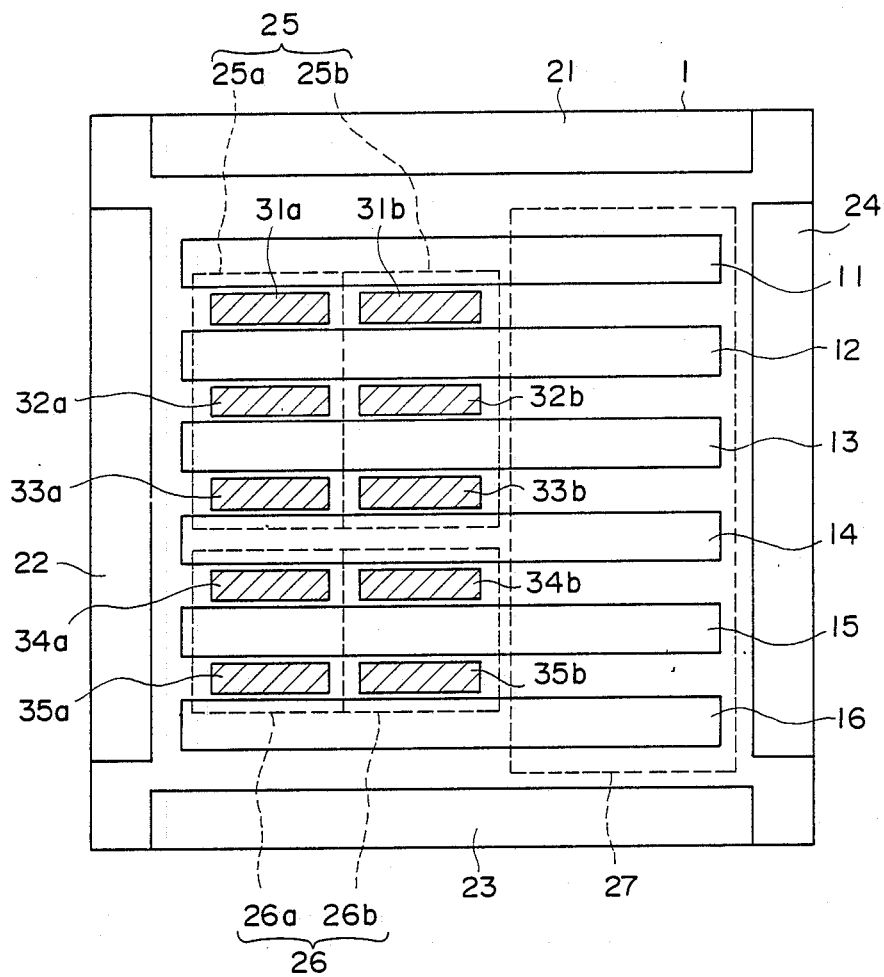
FIG. 1 is a schematic illustration showing in plan view a gate array device constructed in accordance with one embodiment of the present invention.

Referring now to FIG. 1, there is schematically shown a masterslice or gate array device 1 constructed in accordance with one embodiment of the present invention. The illustrated gate array includes a plurality of basic cell regions 11 through 16 arranged in parallel at a predetermined pitch. An intermediate region is provided between any two adjacent ones of the basic cell regions 11 through 16. In the illustrated embodiment, each of the intermediate regions is defined as an interconnection region and it includes a memory cell region comprised of a plurality of memory cells and a function cell region for controlling the operation of the associated memory cell region. The memory cell region is preferably so structured that it can be divided into a plurality of vector spaces, in which one word is comprised of a predetermined number of bits. In addition, it should be noted that the memory cell region can be defined either as a RAM or a ROM, or, alternatively, a combination of a RAM and a ROM.

In the structure shown in FIG. 1, the gate array device 1 includes six basic cell regions 11 through 16, each elongated in shape horizontally, which are located approximately at the center portion as spaced apart from one another at a predetermined pitch and arranged in parallel to each other. As well known in the art, each of the basic cell regions 11 through 16 includes a plurality of basic cells. Also provided in the gate array device 1 are four input/output general purpose cell regions 21 through 24, each located at one of four sides of the generally square-shaped gate array device 1. An intermediate region is provided between any adjacent two of the basic cell regions 11 through 16, and, in the illustrated embodiment, the intermediate region can serve either as a memory cell region, as a function cell region, or as a interconnection region depending on an interconnection pattern applied by final metallization. And, in the left half of each of the intermediate regions defined between the basic cell regions 11 and 12, 12 and 13 and 13 and 14, is provided a pair of function cell regions 31a and 31b, 32a and 32b, or 33a and 33b. Besides, in the left half of each of the intermediate regions defined between the basic cell regions 14 and 15 and 15 and 16, is provided a pair of memory cell regions 34a and 34b or 35a and 35b.

With these memory cell regions 34a and 35a or 34b and 35b, a memory unit 26a and 26b having a 1K byte address space with 1 word (4 bits) per block is defined when a ROM is implemented. It is to be noted that the memory units 26a and 26b together define a memory region 26. On the other hand, with the function cell regions 31a, 32a and 33a or 31b, 32b and 33b, function units 25a and 25b for carrying out various controls of the memory units 26a and 26b are constructed, and the function units 25a and 25b together define a function region 25.

In the case where no memory circuit is desired, a random logic circuit may be constructed in the left half of each of the basic cell regions 11 through 16 in a conventional manner. On the other hand, if a memory circuit is desired, the left half of each of the basic cell regions 11 through 16 is not used a a basic cell region for defining a random logic circuit, but it is used for interconnection among the input/output cell regions 21 through 23, memory region 26 and function region 25. On the other hand, the right half of each of the basic cell regions 11 through 16 constitutes a part of a random logic circuit unit 27, in which basic cells may be interconnected to define a desired logic function. Of importance, in the structure shown in FIG. 1, a pair of memory cell region 31a and an associated function cell region 31b for controlling the operation of the associated memory cell region 31a is provided side by side in an intermediate region between two adjacent basic cell regions, so that there is provided an increased degree of freedom in designing a random logic using the basic cell regions.

Figure 2:
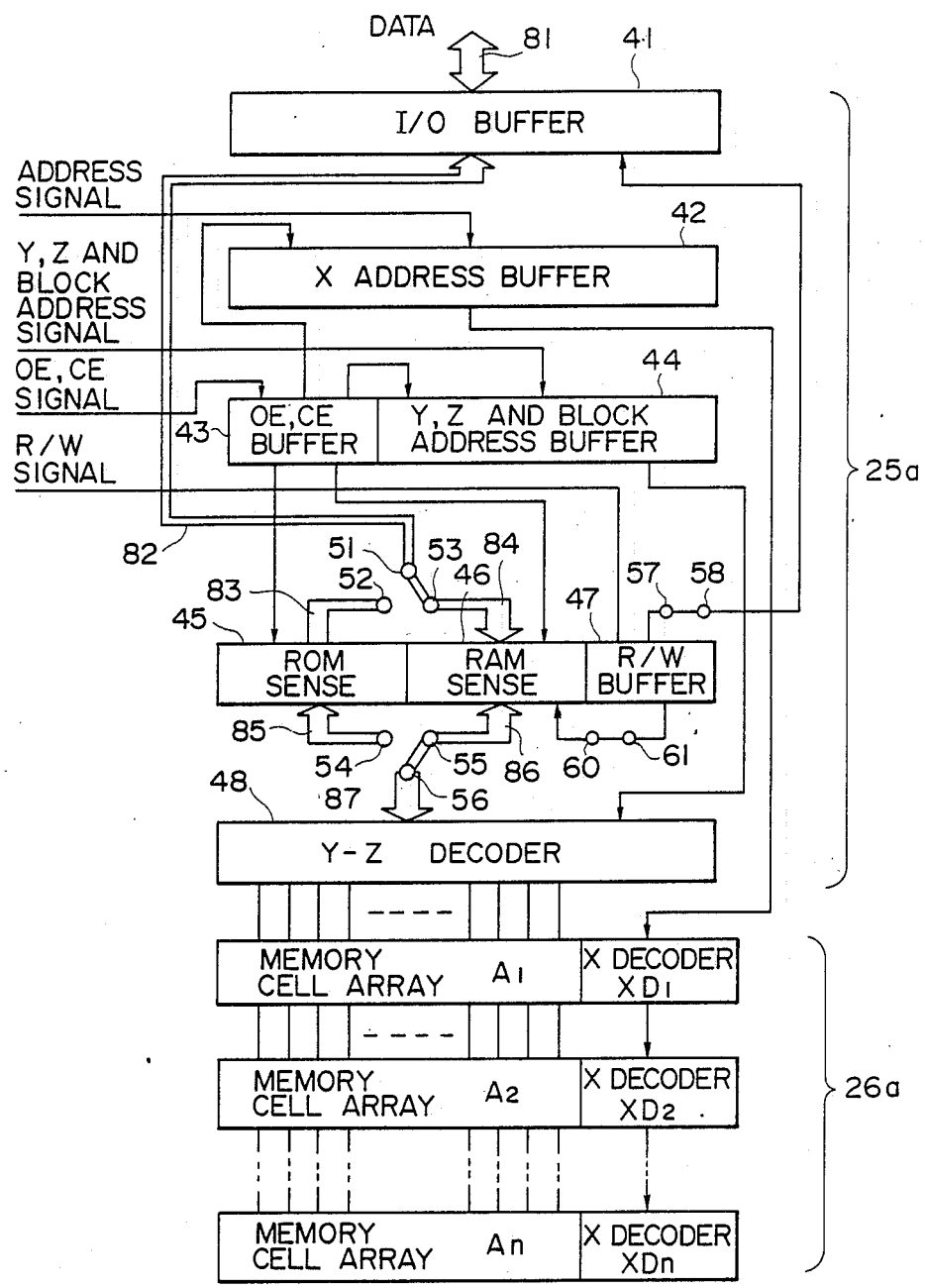
FIG. 2 is a block diagram showing a structure including a memory circuit and its control circuit definable by a part of the structure shown in FIG. 1.

FIG. 2 illustrates in block form a memory circuit and its associated control circuit constructed from the function unit 25a and the memory unit 26a of the integrated circuit shown in FIG. 1. It is to be noted that the function unit 25b and the memory unit 26b may also be used to define the structure shown in FIG. 2. The circuit shown in FIG. 2 includes a memory circuit having a 1K byte address space with one word (4 bits) per block as described above and its control circuit for controlling the operation of the memory unit. Of importance, the structure shown in FIG. 2 may define a static RAM or a mask ROM by applying a final interconnection by metallization. In the structure shown in FIG. 2, the function unit 25a includes an input/output buffer 41, and X address buffer 42, an OE/CE buffer 43, an Y, Z and block address buffer 44, a ROM sense amp. 45, a RAM sense amp. 46, a read/write buffer 47, and a Y-Z decoder 48. On the other hand, the memory unit 26a includes n (where n is a natural number) number of memory cell arrays $A_1$ through $A_n$ and n number of X decoders $XD_1$ through $XD_n$.

The input/output buffer 41 is comprised of a three-state buffer, an input buffer and a RAM write circuit. Thus, during RAM output mode, the three-state buffer and the write circuit are set in operation; whereas, during ROM output mode, the three-state buffer is set in operation. A data input through the input/output cell regions 21 through 24 (FIG. 1) and a 4-bit data bus 81 is input into the input/output buffer 41; on the other hand, a data output from the input/output buffer 41 is output through the data bus 81 and the input/output cell regions 21 through 24. An input/output terminal of the input/output buffer 41 at its memory side is connected to a 4-bit contact 51 through a 4-bit data bus 82. There is provided a 4-bit contact 52 which is connected to a ROM sense unit 45 through a 4-bit data bus 83. Also provided is a 4-bit contact 53 which is connected to a RAM sense unit 46 through a 4-bit data bus 84. In the case of implementation of a RAM, the contact 51 is connected to the contact 53 by metallization; on the other hand, in the case of implementation of a ROM, the contact 51 is connected to the contact 52 by metallization. Such metallization is typically carried out by deposition a metal, such as Al, and patterning the thus deposited metal in a desired interconnection pattern.

Accordingly, during data write-in mode of a RAM, the input/output buffer 41 once stores a write data input through the data bus 81 based on a control signal input from the R/W buffer 47, and, then, outputs the data to the RAM sense unit 46 through the data bus 82, contacts 51 and 53 and data bus 84. On the other hand, during data read out mode of a RAM, the input/output buffer 41 once stores a read out data input from the RAM sense unit 46 through the data bus 84, contacts 53 and 51 and data bus 82 based on a control signal input from the R/W buffer 47 and then outputs the data through the data bus 81. Furthermore, in a ROM implementation, the input/output buffer 41 once stores a data input from the ROM sense unit 45 through the data bus 82, contacts 52 and 51 and data bus 82 and then outputs the data through the data bus 81.

The OE/CE buffer 43 responds to an OE signal and a CE signal input from an external circuit and supplies control signals for controlling read out from the memory and write-in to the memory to the X address buffer 42, Y, Z and block address buffer 44, ROM sense unit 45 and RAM sense unit 46. The X address buffer 42 once stores an X address signal input from an external circuit based on a control signal supplied from the OE/CE buffer 43 and then outputs the address signal to the X decoders $XD_1$ through $XD_n$. These Y, Z and block address buffer 44 once stores an Y address signal, a Z address signal and a block address signal supplied from an external circuit based on a control signal supplied from the OE/CE buffer 44 and then outputs these signals to the Y-Z decoder 48. The R/W buffer 47 supplies a read out signal or a write-in signal to the input/output buffer 41 through contacts 57 and 58 based on a R/W which has been input and also to the RAM sense unit 46 through contacts 61 and 60. It is to be noted that an electrical connection between the contacts 57 and 58 and also an electrical connection between the contacts 60 and 61 may be established by metallization when implementing a RAM.

The memory unit 26a includes n number of memory cell arrays $A_1$ through $A_n$, each of which preferably includes a plurality of memory cells as will be described later. The memory unit 26a may be implemented either as a static RAM or as a mask ROM by appropriate metallization. Each of the memory arrays $A_1$ through $A_n$ is connected to predetermined bit and word lines and also to the Y-Z decoder 48. The Y-Z decoder 48 selects one of the memory cells provided in the memory cell arrays $A_1$ through $A_n$ based on a Y address, Z address and block address supplied from the Y, Z and block address buffer 44, and, during RAM write-in mode, outputs a data input from the RAM sense unit 46 through the 4-bit data bus 86, 4-bit contacts 55 and 56 and 4-bit data bus 87 into the memory cell array $A_1$ through $A_n$, or during RAM read out mode, outputs a data input from the memory cell array $A_1$ through $A_n$ to the RAM sense unit 46 through the data bus 87, 4-bit contacts 56 and 55 and 4-bit data bus 86. Moreover, during ROM read out mode, a data input from the memory arrays $A_1$ through $A_n$ is output to the ROM sense unit 45 through the data bus 87, contacts 56 and 54 and data bus 85. In RAM implementation, the contact 56 is electrically connected to the contact 55 by metallization and on the other hand in ROM implemetation the contact 56 is electrically connected to the contact 54 by metallization.

During read out mode, the RAM sense unit 46 determines a data input from the data bus 86 to be either "1" or "0" and outputs the data of the result of determination to the input/output buffer 41 through the data bus 84, contacts 53 and 51 and data bus 82. On the other hand, during write-in mode, the RAM sense unit 46 outputs a predetermined write voltage to the Y-Z decoder 48 through the data bus 86, contacts 55 and 56 and data bus 87 in response to a data input from the data bus 84. On the other hand, the ROM sense unit 45 determines a data input from the data bus 85 to be either "1" or "0" and the data as a result of the determination is output to the input/output buffer 41 through the data bus 83, contacts 52 and 51 and data bus 82.

Figure 3:
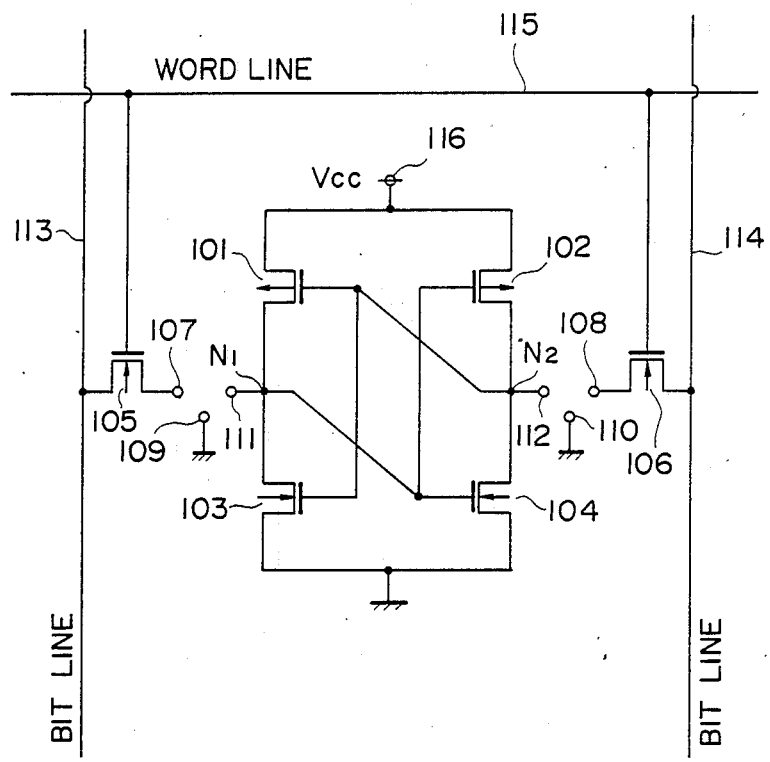
FIG. 3 is a schematic illustration showing a memory cell which is constructed in accordance with another embodiment of the present invention and which may be advantageously used in the structure in FIG. 1 or 2.

FIG. 3 shows in circuit diagram a single memory cell which may be advantageously provided in each of the memory cell arrays $A_1$ through $A_n$. As shown, the illustrated memory cell includes a pair of PMOSFETs 101 and 102 serving as load resistor elements and a pair of driver NMOSFETs 103 and 104, which are cross coupled. That is, MOSFETs 103 and 104 have their sources commonly connected to ground and MOSFETs 101 and 102 have their sources commonly connected to a supply voltage $V_{cc}$. A node $N_1$ between the drains of MOSFETs 101 and 103 is connected to the gate of each of MOSFETs 102 and 104, and a node $N_2$ between MOSFETs 102 and 104 is connected to the gate of each of MOSFETs 101 and 103. As a result, there is formed a flip-flop by these MOSFETs 101 through 104. A pair of bit lines 113 and 114 run vertically as spaced apart from each other over a predetermined distance and the flip-flop formed by MOSFETs 101 through 104 is located between these bit lines 113 and 114. Also provided is an NMOSFET 105 which has its drain connected to the bit line 113. In addition, an NMOSFET 106 is provided and its drain is connected to the other bit line 114. These MOSFETs 105 and 106 serve as gates for establishing write/read mode selectively. Also provided is a work line 115 which runs horizontally in FIG. 3 and it is connected to the gate of each of MOSFETs 105 and 106.

MOSFET 105 has a source which is connected to a contact 107 and a contact 111 is provided as connected to the node $N_1$ of the flip-flop. Also provided is a contact 109 which is grounded. It is to be noted that these contacts 107, 109 and 111 are so disposed such that the contact 107 may be electrically connected to the contact 109 by metallizaion when establishing one binary state in a ROM implementation and the contact 107 may be electrically connected to the contact 111 by metallization when implementing a RAM. Similarly, MOSFET 106 has a source which is connected to a contact 108, and there is provided a contact 112 which is connected to node $N_2$ of the flip-flop. Also provided is a contact 110 which is grounded. These contacts 108, 110 and 112 are also disposed such that the contact 108 may be electrically connected to the contact 110 by metallization when establishing one binary state in a ROM implementation and the contact 108 may be electrically connected to the contact 112 when implementing a RAM.

When using the memory cell shown in FIG. 3 in a RAM implementation, contacts 107 and 111 and contacts 108 and 112 are electrically connected by metallization as described above. With this electrical connection, the flip-flop may serve as a memory for storing a 1-bit data, thereby defining a 1-bit RAM. In the case where this memory cell is to be used in a ROM implementation in the structure shown in FIG. 3, there is defined a 1-bit ROM having a fixed binary state of either "0" or "1" depending on whether or not the contact 107 of MOSFET 105 is electrically connected to the contact 109 by metallization. On the other hand, there is defined a 1-bit ROM having a fiuxed binary state of either "0" or "1" depending on whether or not the contact of MOSFET 106 is electrically connected to the contact 110 by metallization. In this manner, in the structure shown in FIG. 3, a ROM memory unit having two bits of information may be defined by a single memory cell. Thus, as described above, depending on a particular connection selected for the single memory cell, it can be defined either as a ROM memory unit having two bits of information or as a RAM memory unit having one bit of information.

In this manner, a structure defined by a memory circuit and its control circuit, including the memory unit 26a comprises of memory cell arrays $A_1$ through $A_n$, each provided with a plurality of memory cells shown in FIG. 3, and the function unit 25a, constitutes a memory having a 1K byte address space with one word (4-bits) per block. Similarly, a structure defined by a memory circuit and its control circuit, including the memory unit 26b and the function unit 25b, also constitutes a memory having a 1K byte address space with one word (4 bits) per block. In addition, as described above, each combination of a memory circuit and its control circuit can be defined either as a RAM memory unit or as a ROM memory unit by selecting an appropriate electrical connection for the contacts by metallization. Thus, the integrated circuit shown in FIG. 1 may be defined either as a RAM or a ROM, or, alternatively, as a combination of a RAM and a ROM. In addition, if a memory circuit is not desired, the entire integrated circuit 1 of FIG. 1 may be used for defining a random logic circuit. On the other hand, it is to be noted that that portion of the integrated circuit 1 which is not provided with the memory units 26a and 26b and the function units 25a and 25b is reserved as a random logic circuit section 27 for defining a desired random logic circuit using the corresponding portions of the basic cell regions 11 through 16 in a conventional manner.

In the above-described embodiment, a pair of memories, each having a 1K byte address space with one word/4 bits per block is provided in a one-chip integrated circuit device; however, if desired, more than two memories may be provided in one chip. Besides, the number of bits or memory capacity per one word of each memory may be set at a different value.

Figure 4:
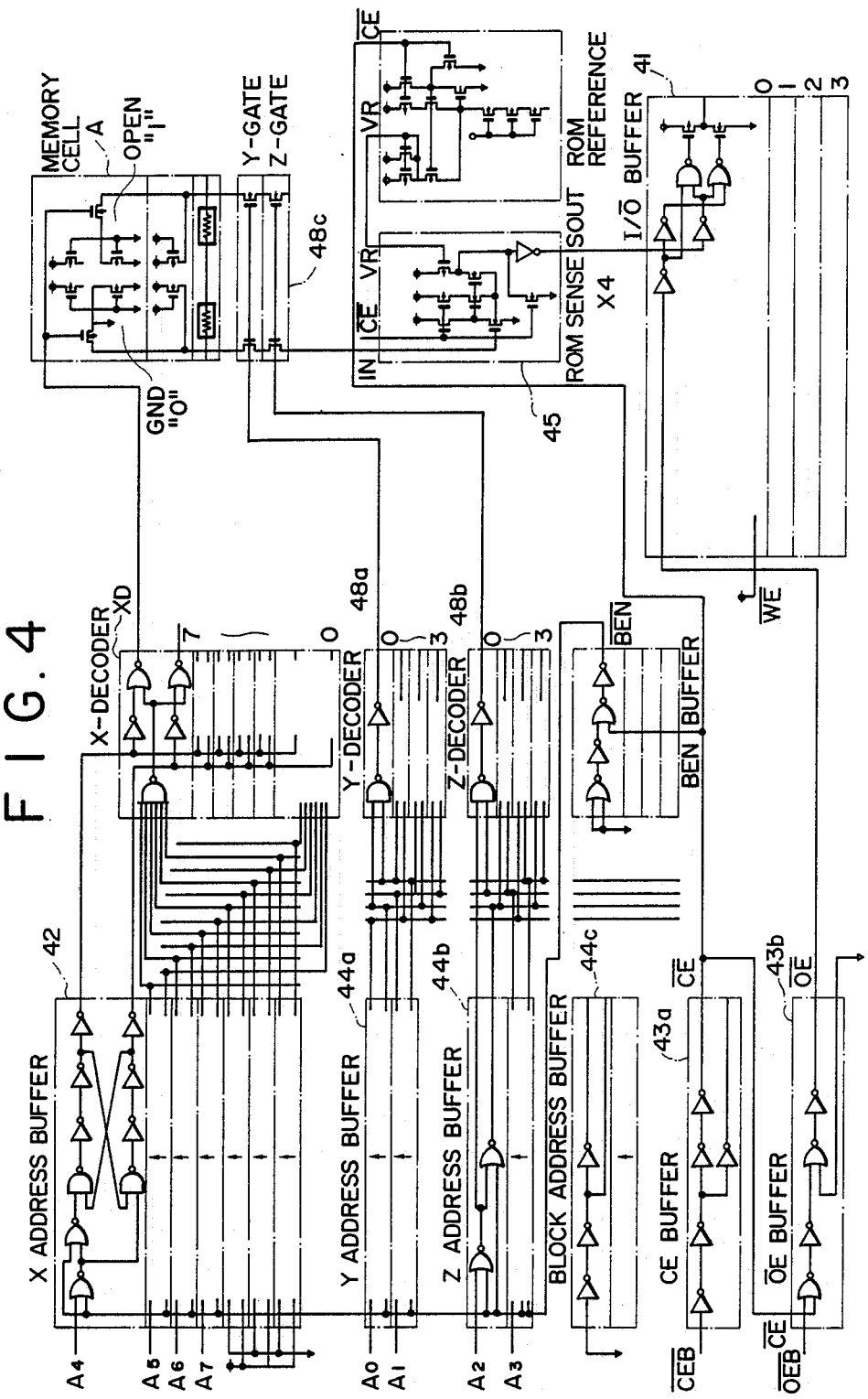
FIG. 4 is a schematic illustration showing the detailed structure of a gate array device including a ROM defined by applying a suitable interconnection by metallization to the structure shown in FIGS. 1 and 2.

FIG. 4 shows partly in circuit diagram and partly in logic diagram an example of a ROM implementation using the structure shown in FIG. 2. On the other hand, FIG. 5 shows an example of a RAM implementation using the structure shown in FIG. 2.

Figure 6:
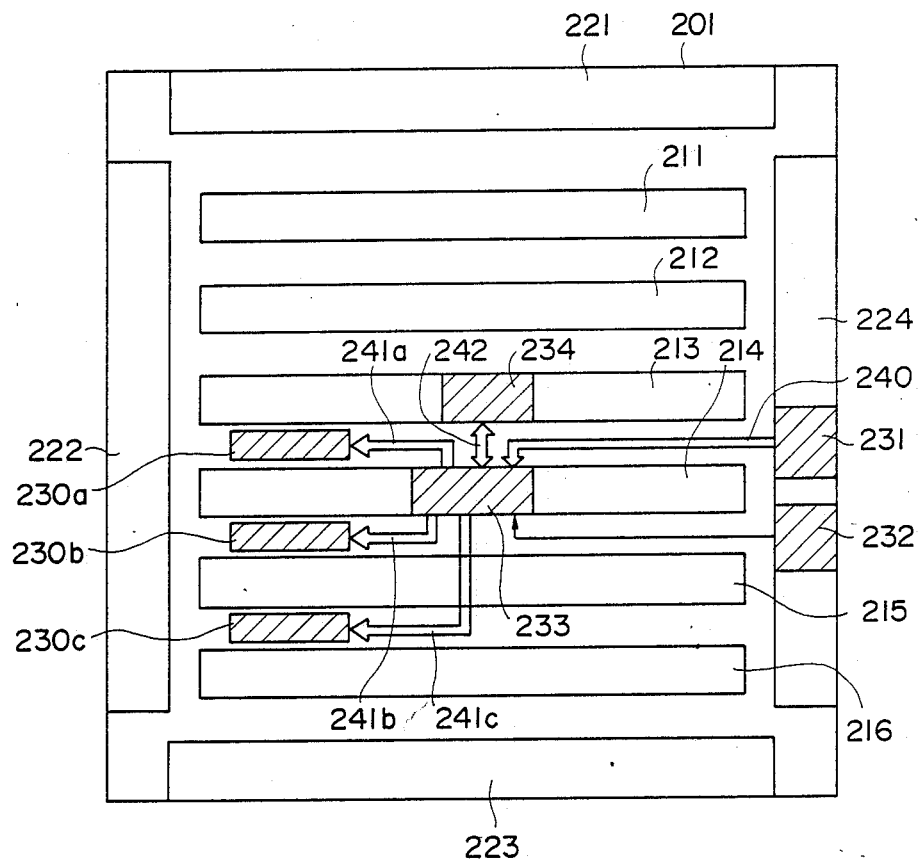
FIG. 6 is a schematic illustration showing a gate array device provided with a high voltage detecting circuit and a multiplexer constructed in accordance with a further embodiment of the present invention.

Referring now to FIG. 6, there is schematically shown a masterslice or gate array device 201 having a high voltage detecting circuit and a multiplexer constructed in accordance with one embodiment of the present invention. The illustrated gate array device 201 includes a plurality of basic cell regions 211 through 216, each elongated in shape and arranged in parallel. An intermediate region is defined between any two adjacent ones of the plurality of basic cell regions 211 through 216. Each of the intermediate regions may serve as an interconnection region for interconnecting the basic cell regions and at least some of the intermediate regions include memory cell regions 230a through 230c. The gate array device 201 includes an input/output cell region 224 which is provided with a high voltage detecting (HVD) circuit 232. Of importance, when a predetermined voltage is applied to the HVD circuit 232, a test mode is established, wherein the memory cells of the memory cell regions 230a through 230c may be tested.

Described more in detail, the gate array device 201 illustrated in FIG. 6 includes six basic cell regions 211 through 216 elongated in shape arranged as spaced apart from one another and in parallel to each other approximately at the central portion. Each of the basic cell regions 211 through 216 may be comprised of a plurality of basic cells of any structure well known for those skilled in the art. The gate array device 201 also includes four input/output general purpose cell regions 221 through 224 each provided at one side edge of the generally square-shaped gate array device 201. In addition, a memory cell region 230a is defined in the left end portion of the intermediate region between the basic cell regions 213 and 214. Similarly, each of memory cell regions 230b and 230c is formed in the left end portion of each of the intermediate regions between the basic cell regions 214 and 215 and 215 and 216, respectively. These memory cell regions 230a through 230c together constitute a memory circuit unit 230 in the gate array device 201.

On the other hand, the basic cell region 213 is provided with a logic circuit unit 234 for carrying out various controls of the memory circuit unit 230 as formed approximately at its central portion thereof. In addition, the input/output cell region 224 is provided with an input/output circuit unit 231 for inputting a signal to the memory circuit unit 230 approximately at its center and with the HVD circuit 232 for outputting a control signal for establishing a test mode by detecting a predetermined voltage when testing the memory circuit unit 230 to the multiplexer 233. Besides, the basic cell region 214 is provided with the multiplexer 233 approximately at its center. The multiplexer 233 selectively switches either to output a signal input from the input/output circuit unit 231 to the memory circuit unit 230 through a logic circuit unit 234 in response to a control signal input from the HVD circuit 232, or to output the above-mentioned signal directly to the memory circuit unit 230 while bypassing the logic circuit unit 234.

In the intermediate region defined between the basic cell region 213 and 214 are formed a bus 240 for connecting the input/output circuit unit 231 and the multiplexer 233, a bus 242 for connecting the multiplexer 233 and the logic circuit unit 234 and a bus 241a for connecting the multiplexer 233 and the memory cell region 230a. In addition, in the intermediate region between the basic cell regions 214 and 215 is formed a bus 241b for connecting the multiplexer 233 and the memory cell region 230b. And, a bus 241c for connecting the multiplexer 233 and the basic cell region 230c is formed as extending in the intermediate region between the basic cell regions 214 and 215, above the basic cell region 215 and in the intermediate region between the basic cell regions 215 and 216. With the above-described structure shown in FIG. 6, the basic cell regions 211 and 212 may be used to define a random logic circuit unit. The basic cell regions 215 and 215 may be used as interconnection regions for the memory cell regions 230a through 230c.

Figure 7:
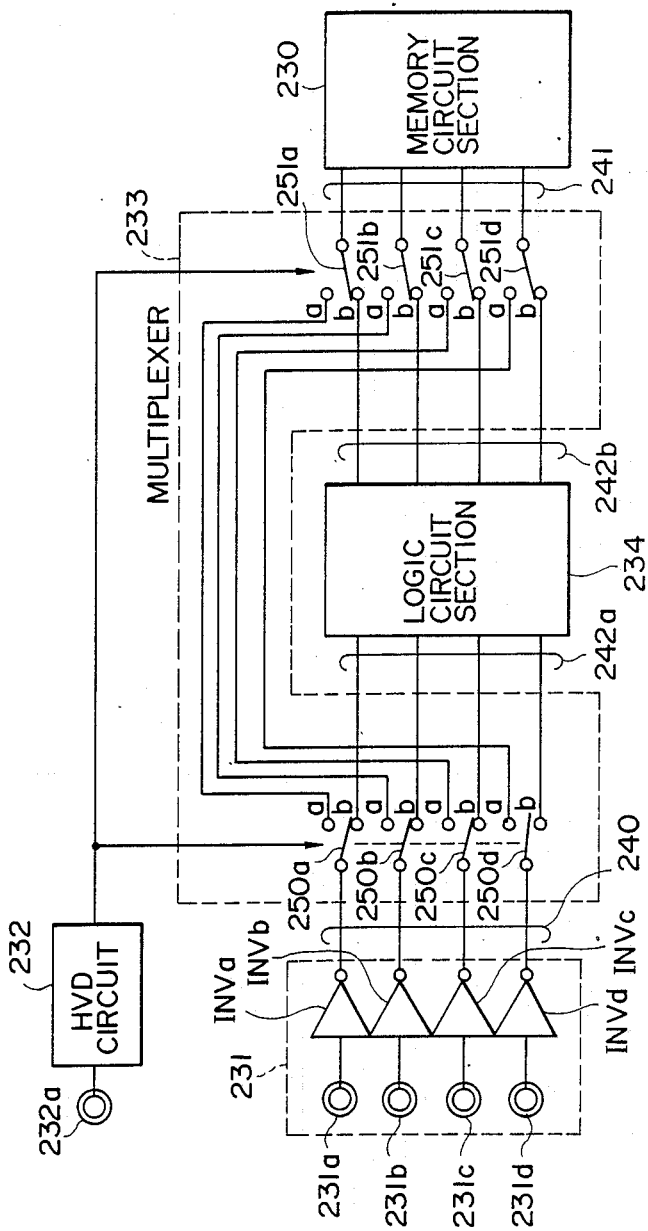
FIG. 7 is a circuit diagram showing partly in blocks a memory circuit and its peripheral circuit provided in the gate array device of FIG. 6.

FIG. 7 shows more in detail the multiplexer 233 and its peripheral circuit portion for selectively switching between a test mode for testing the memory circuit unit 230 defined in the gate array device 201 and a normal operating mode for inputting or outputting a signal. It is to be noted that those elements in FIG. 7 which are identical to those shown in FIG. 6 are indicated by identical numerals. It should also be noted that, although only 4-bit signal lines are shown in FIG. 7, use may be made of any desired number of signal lines for interconnections. Besides, the multiplexer 233 is shown to include analog switches 250a through 250d and 251a through 251d as turn-over switches; however, these turn-over switches may also be formed by using the basic cells provided in the basic cell region 214.

With the structure shown in FIG. 7, when a voltage, for example, of 10 V or more is applied to a terminal 232a, the HVD circuit 232 outputs a low or L level control signal, which is at ground level; whereas, when a voltage of less than 10 V is applied to the terminal 232a, a control signal of a high or H level, for example, of 5 V is output. In response to the control signal supplied from the HVD circuit 232, the multiplexer 233 causes all of the turn-over switches 250a through 250d and 251a through 251d either to contacts a (test mode) or to contacts b (normal operating mode) at the same time. That is, when a H level control signal is applied to the multiplexer 233, all of the turn-over switches 250a through 250d and 251a through 251d are switched to respective contacts b at the same time to thereby establish the normal operating mode. As a result, a signal input to input terminals 231a through 231d of the input-/output circuit unit 231 is input into the memory circuit unit 230 through inverters INVa through INVd, bus 240, contacts b of the turn-over switches 250a through 250d of the multiplexer 233, bus 242a, logic circuit unit 234, bus 242b, turn-over switches 251a through 251d and bus 241. On the other hand, when the L level control signal is applied to the multiplexer 233, all of the turn-over switches 250a through 250d and 251a through 251d are switched to contacts a at the same time to thereby establish the test mode. As a result, a signal input into the input terminals 231a through 231d is directly input into the memory circuit unit 230 while bypassing the logic circuit unit 234, thereby permitting to check the operation of the memory circuit unit 230.

Figure 8:
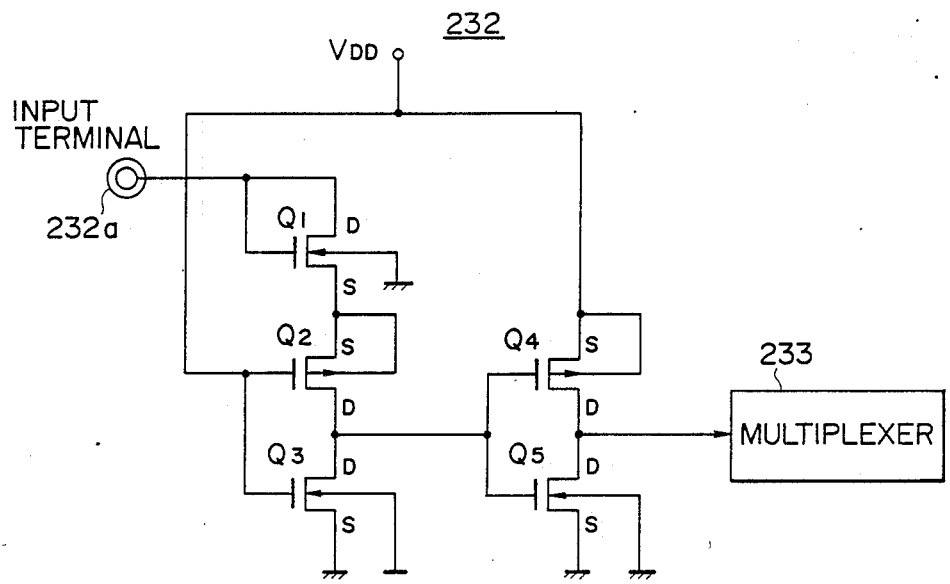
FIG. 8 is a circuit diagram showing in detail the high voltage detecting circuit provided in the gate array device of FIG. 6.

FIG. 8 shows in circuit diagram the detailed structure of the HVD circuit 232 when constructed using a CMOS integrated circuit having a P type substrate and an N well. In the structure shown in FIG. 8, an input terminal 232a is connected to the gate and the drain of an N-channel MOSFET $Q_1$ which has its substrate connected to ground and its source connected to the source and the substrate of a P-channel MOSFET $Q_2$. A d.c. $V_{DD}$, for example, of 5 V is coupled to the gate of each of MOSFET $Q_2$ and N-channel MOSFET $Q_3$. MOSFET $Q_3$ has its source and substrate both connected to ground. Also provided are a P-channel MOSFET $Q_4$ and an N-channel MOSFET $Q_5$ as connected in a manner similar to MOSFETs $Q_2$ and $Q_3$. MOSFETs $Q_2$ and $Q_3$ have their their drains commonly connected to the gate of each of MOSFETs $Q_4$ and $Q_5$. MOSFET $Q_4$ has its source and substrate connected to d.c. supply voltage $V_{DD}$, and MOSFETs $Q_4$ and $Q_5$ have their drains commonly connected and also to a control signal input terminal of the multiplexer 233.

Figure 9:
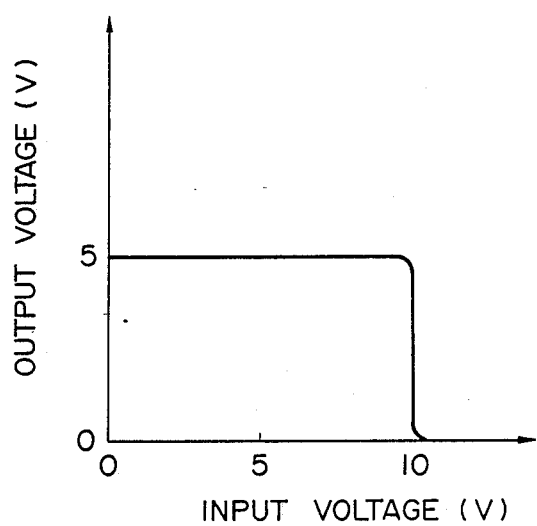
FIG. 9 is a graph showing the input/output characteristic of the high voltage detecting circuit shown in FIG. 8.

The operation of the HVD circuit 232 having the above-described structure will now be described with reference to an input/output characteristic shown in FIG. 9. When a ground level voltage is applied to the input terminal 232a, MOSFETs $Q_1$ and $Q_2$ are turned off and MOSFET $Q_3$ is turned on, so that the voltage at the gate of each of MOSFETs $Q_4$ and $Q_5$ is set at ground level. Thus, MOSFET $Q_4$ is turned on; on the other hand, MOSFET $Q_5$ is turned off. As a result, the H level control signal at supply voltage $V_{DD}$ is supplied to the control signal input terminal of multiplexer 233. On the other hand, when a voltage of approximately twice of supply voltage $V_{DD}$ ( 10 V in the illustrated embodiment) is applied to the input terminal 232a, MOSFETs $Q_1$, $Q_2$ and $Q_3$ are turned on, so that the voltage at the drain of each of MOSFETs $Q_2$ and $Q_3$ is set approximately at supply voltage $V_{DD}$. Thus, MOSFET $Q_4$ is turned off and MOSFET $Q_5$ is turned on, so that the L level control signal at ground level is supplied to the control signal input terminal of multiplexer 233.

As described above, depending on whether or not a voltage of approximately twice of d.c. supply voltage $V_{DD}$ is applied to the input terminal of HVD circuit 232 formed in the input/output cell region 234, the memory circuit unit 230 may be set either in the test mode or in the normal operating mode. In the illustrated embodiment, since the input terminals 231a through 231d of the input/output circuit unit 231 may be commonly used as input terminals for a test signal in the test mode, the area required for the memory circuit unit 230 in the input-/output cell region 224 may be minimized. It is to be noted that in the above-described embodiment, although the memory cell regions 230a through 230c of the memory circuit unit 230 are formed in the intermediate regions between the basic cell regions, these memory cell regions 230a through 230c may also be formed in the basic cell regions, if desired. Besides, the above-described embodiment is a test circuit for a memory circuit; however, this aspect of the present invention should not be limited only to a memory circuit, but this aspect of the present invention is equally applicable to a gate array device provided with other function cells, such as a multiplication microprocessor.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A gate array device comprising:
   a plurality of basic cell regions spaced apart from one another to thereby define a plurality of intermediate regions between any two adjacent ones of said plurality of basic cell regions, at least part of each of said plurality of intermediate regions being defined as a memory region when constructing memory cells and as an interconnection region when constructing basic cells;
   a logic circuit defined by a first part of said plurality of basic cell regions;
   at least one input/output buffer which includes mode setting means for setting a mode of operation by outputting a mode set signal and at least one input terminal to which a signal is input; and switching means defined by a second part of said plurality of basic cell regions, said switching means causing said input terminal of memory cell to be coupled to said memory region through said logic circuit, thereby establishing a normal operating mode, or directly to said memory region while bypassing said logic circuit, thereby establishing a test mode, in accordance with a status of said mode set signal.

2. The device of claim 1, wherein said switching means includes a multiplexer.

3. The device of claim 1, wherein said mode set signal is a binary state signal whereby said normal operating mode is set when said mode set signal has a first binary state and said test mode is set when said mode set signal has a second binary state.

4. The device of claim 3, wherein said mode setting means includes a high voltage detecting circuit for detecting a level of a signal supplied thereto exteriorly, whereby said high voltage detecting circuit outputs said mode set signal having said first binary state when said signal has been detected to have a high level and outputs said mode set signal having said second binary state when said signal has been detected to have a low level.

* * * * *